United States Patent
Iijima

(10) Patent No.: US 7,382,014 B2
(45) Date of Patent: Jun. 3, 2008

(54) SEMICONDUCTOR DEVICE WITH CAPACITOR SUPPRESSING LEAK CURRENT

(75) Inventor: Shinpei Iijima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/434,877

(22) Filed: May 17, 2006

(65) Prior Publication Data

US 2006/0273426 A1 Dec. 7, 2006

(30) Foreign Application Priority Data

May 17, 2005 (JP) ............................. 2005-144780

(51) Int. Cl.
*H01L 27/108* (2006.01)
*H01L 29/76* (2006.01)
*H01L 29/94* (2006.01)
*H01L 31/119* (2006.01)

(52) U.S. Cl. ................... 257/310; 257/296; 257/298; 257/299; 257/300; 257/306; 257/307; 257/308; 257/309; 257/311; 257/312; 257/313

(58) Field of Classification Search .......... 257/296, 257/298–300, 306–313
See application file for complete search history.

(56) References Cited

U.S. PATENT DOCUMENTS

| 6,445,033 | B1* | 9/2002 | Hasegawa ............. 257/324 |
| 6,632,721 | B1* | 10/2003 | Iijima et al. ............. 438/398 |
| 6,690,052 | B2 | 2/2004 | Park et al. |
| 6,849,505 | B2 | 2/2005 | Lee et al. |
| 2001/0029113 | A1* | 10/2001 | Kunitomo et al. ......... 438/785 |
| 2004/0051132 | A1* | 3/2004 | Weimin ................. 257/310 |
| 2004/0077142 | A1* | 4/2004 | Chao et al. ............ 438/253 |
| 2006/0274477 | A1* | 12/2006 | Basceri et al. .......... 361/311 |

FOREIGN PATENT DOCUMENTS

| JP | 2001-237401 A | 8/2001 |
| JP | 2003-100908 A | 4/2003 |
| JP | 2004-023043 A | 1/2004 |

* cited by examiner

*Primary Examiner*—Ida M. Soward
(74) *Attorney, Agent, or Firm*—McDermott Will & Emery LLP

(57) ABSTRACT

A semiconductor device with a capacitor includes a lower electrode, a dielectric and an upper electrode on the dielectric layer. The dielectric layer including more than one polycrystalline tantalum oxide layer and more than one separation layer, wherein the polycrystalline tantalum oxide layers and the separation layers are alternately stacked, while one of the polycrystalline tantalum oxide layers is a lowermost layer among the stacked layers.

9 Claims, 11 Drawing Sheets

SEMICONDUCTOR DEVICE WITH CAPACITOR SUPPRESSING LEAK CURRENT

BACKGROUND OF THE INVENTION

This invention relates to a semiconductor device with a capacitor, especially a semiconductor memory device such as a dynamic random access memory and a method for manufacturing the same.

A capacitor having a dielectric layer made of tantalum oxide is disclosed in JP-A 2001-237401, JP-A 2003-100908 or JP-A 2004-23043.

The tantalum oxide in dielectric layer is amorphous just after the deposition. The dielectric constant of the amorphous tantalum oxide is lower than that of the polycrystalline tantalum oxide.

SUMMARY OF THE INVENTION

The crystallized tantalum oxide single layer of about 10 nm has several crystal grain boundaries. There are depressions on the surface of the crystallized tantalum oxide at the crystal grain boundaries so that the surface of the crystallized tantalum oxide has thin areas at the crystal grain boundaries. Leak current of the capacitor is caused by existence of the crystal grain boundaries extending through out the dielectric layer and by the thin areas.

It is an object of the present invention to provide a semiconductor device with a capacitor which can suppress leak current.

According to an aspect of the present invention, there is provided a semiconductor device with a capacitor comprises a lower electrode, a dielectric and an upper electrode on the dielectric layer. The dielectric layer comprising one or more polycrystalline tantalum oxide layers and one or more separation layers, wherein the polycrystalline tantalum oxide layers and the separation layers are alternately stacked, while one of the polycrystalline tantalum oxide layers is a lowermost layer among the stacked layers.

According to another aspect of the present invention, there is provided a method for manufacturing a semiconductor memory device comprising: providing a semiconductor substrate; forming a lower electrode on the substrate; alternately stacking one or more polycrystalline tantalum oxide layers and one or more separation layers to form a dielectric layer, wherein one of the polycrystalline tantalum oxide layers is a lowermost layer among the stacked layers; and forming an upper electrode on the dielectric layer.

These and other objects, features and advantages of the present invention will become more apparent upon reading of the following detailed description along with the accompanied drawings.

DESCRIPTION OF PREFERRED EMBODIMENTS

Figure 1:
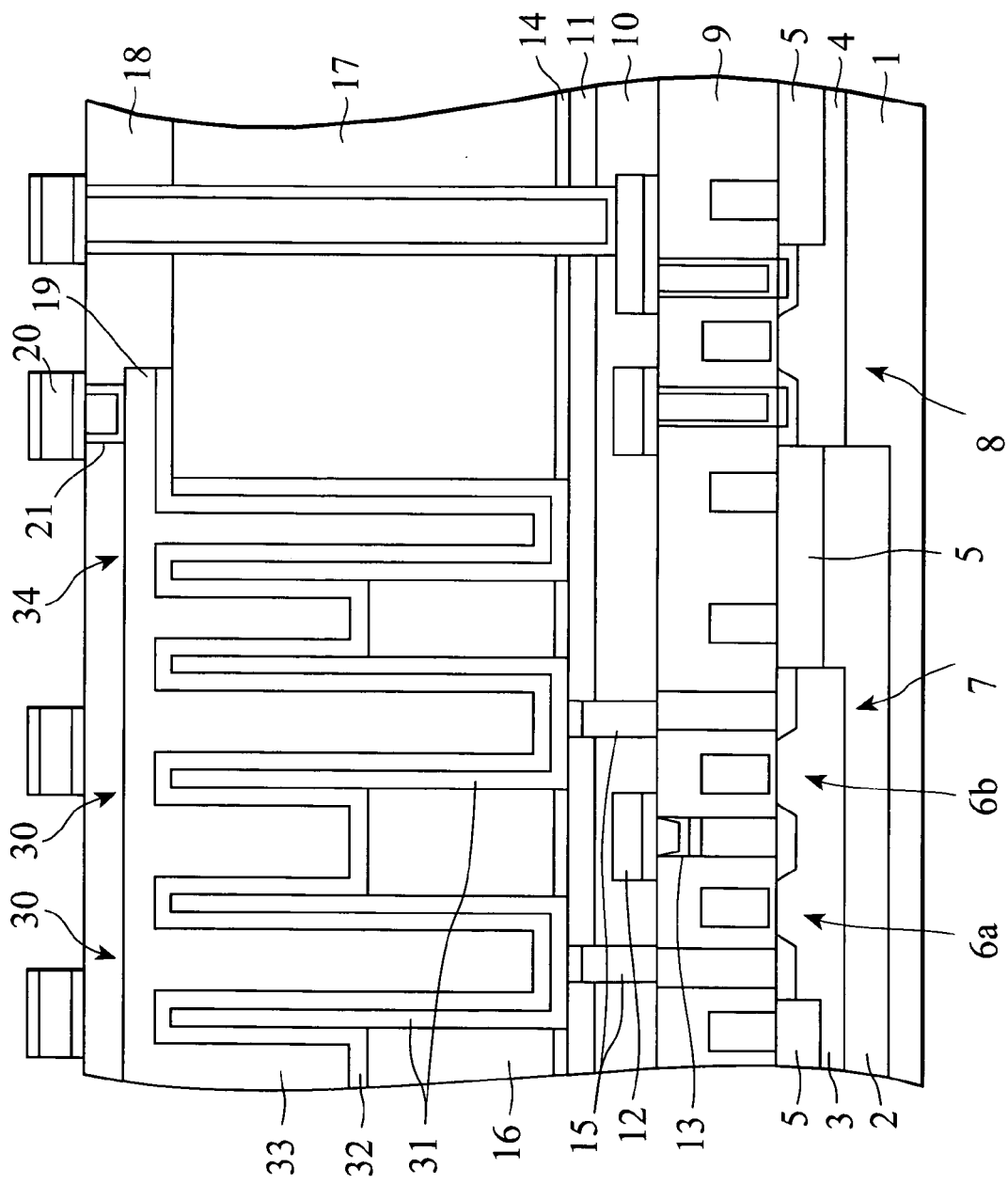
FIG. 1 is a partial sectional view of the semiconductor memory device of an embodiment of the present invention.

FIG. 1 illustrates a DRAM comprising a capacitor of a first embodiment of the present invention. Cross-hatching in FIG. 1 is omitted for the sake of clarity. The DRAM comprises a p-type silicon substrate 1 provided with an n-well region 2, a first p-well region 3, a second p-well region 4 and an isolation region 5. The n-well region 2 is formed in the p-type silicon substrate 1. The first p-well region 3 is formed in the n-well region 2. The second p-well region 4 is formed in the p-type silicon substrate 1. The isolation region 5 is arranged to isolate the first p-well region 3 and the second p-well region 4, and also arranged to divide the first p-well region 3 and the second p-well region 4 into smaller regions respectively. The DRAM has a region of memory cell array 7 and a region of peripheral circuit 8. The first p-well region 3 is arranged in the region of memory cell array 7. The second p-well region 4 is arranged in the region of peripheral circuit 8.

The p-type silicon substrate 1 is covered by a first insulator 9. The first insulator 9 is covered by a second insulator 10. The second insulator 10 is covered by a third insulator 11. In the first p-well region 3 and the first insulator 9, a first switching transistor 6a and a second switching transistor 6b are provided.

In the second insulator 10 and the third insulator 11, a bit line 12 is arranged. In the first insulator 9, a bit line contact 13 is formed to electrically connect the bit line 12 with the first switching transistor 6a and the second switching transistor 6b. The third insulator 11 is covered by a fourth insulator 14. In this embodiment, the fourth insulator 14 may be made of silicon nitride or silicon oxynitride.

Within the region of memory cell array 7, the fourth insulator 14 is covered by a fifth insulator 16. Within the region of memory cell array 7, a plurality of stack trench capacitors 30 are arranged on the third insulator 11. The fourth insulator 14 and the fifth insulator 16 laterally surround lower part of the stack trench capacitors 30. The stack trench capacitor 30 comprises a lower electrode 31, a dielectric layer 32 and an upper electrode 33. The lower electrode 31 is made of tungsten nitride. In the first insulator 9 and the second insulator 10, a conductive plug 15 is arranged to electrically connect the lower electrode 31 with the first switching transistor 6a or the second switching transistor 6b.

The first switching transistor 6a and the second switching transistor 6b serve to switch connections between the bit line 12 and the lower electrodes 31.

In the region of peripheral circuit 8, the fourth insulator 14 is covered by a sixth insulator 17. Between the sixth insulator 17 and the stack trench capacitors 30, a dummy trench-like capacitor 34 is arranged to surround all the stack trench capacitors 30 in the region of memory cell array 7. An inside of the dummy trench-like capacitor 34 is covered by a same material as the stack trench capacitor 30. The sixth insulator 17 and the upper electrode 33 of the stack trench capacitor 30 are covered by a seventh insulator 18.

The upper electrode 33 is in contact with a lead line 19 extending from the region of memory cell array 7 into the region of peripheral circuit 8. On the seventh insulator 18, a line 20 is arranged. In the seventh insulator 18, a contact plug 21 is formed to electrically connect the lead line 19 with the line 20.

The DRAM may includEOTher insulators, contact plugs and lines, and so on.

Figure 2:
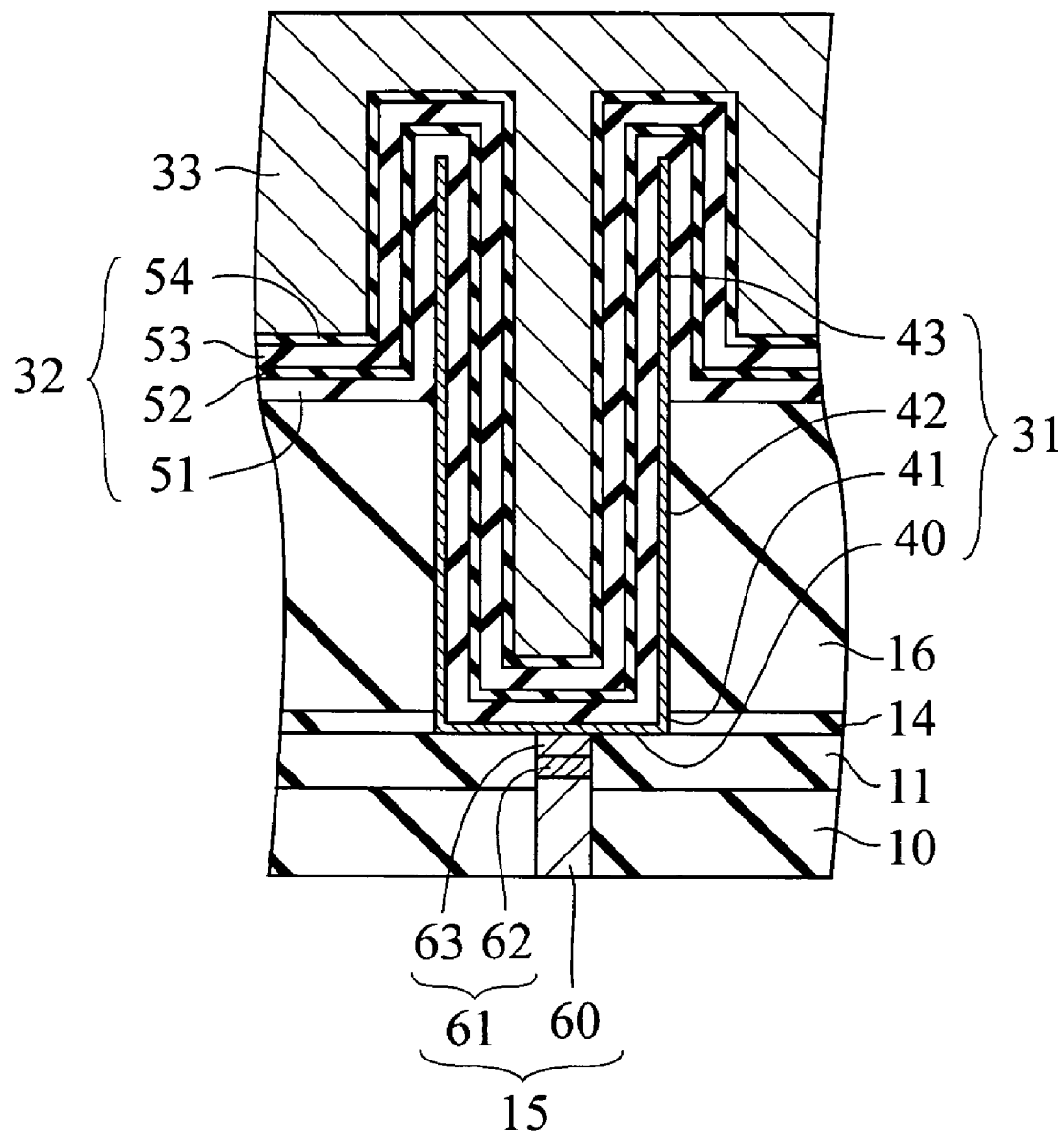
FIG. 2 is a partial sectional view of the stack trench capacitor of FIG. 1.

Referring to FIG. 2, the lower electrode 31 comprises a bottom portion 40, a lower sidewall portion 41, a middle sidewall portion 42 and an upper sidewall portion 43. The bottom portion 40 has a circular plate-like shape and extends on the third insulator 11. The lower sidewall portion 41 upwardly extends from the edge of the bottom portion 40 and has a cylindrical shape. The middle portion 42 upwardly extends from a top of the lower sidewall portion 41. The upper sidewall portion 43 upwardly extends from a top of the middle sidewall portion 42. The fourth insulator 14 laterally surrounds an outside of the lower sidewall portion 41. The fifth insulator 16 laterally surrounds an outside of the middle sidewall portion 42.

The dielectric portion 32 comprises one or more polycrystalline tantalum oxide layers and one or more separation layers. The polycrystalline tantalum oxide layers and the separation layers are alternately stacked. In this embodiment, the dielectric portion 32 comprises a first polycrystalline tantalum oxide layer 51, a first separation layer 52, a second polycrystalline tantalum oxide layer 53 and a second separation layer 54. The first polycrystalline tantalum oxide layer 51 is arranged over an inside surface of the lower electrode 31, an outside and a top of the upper sidewall portion 43 and the fifth insulator 16. The first polycrystalline tantalum oxide layer 51 is a lowermost layer among the stacked layers in the dielectric layer 32. The first separation layer 52 is arranged over the first polycrystalline tantalum oxide layer 51. The second polycrystalline tantalum oxide layer 53 is arranged over the first separation layer 52. The second separation layer 54 is arranged over the second polycrystalline tantalum oxide layer 53. The upper electrode 33 is arranged over the dielectric layer 32. In this embodiment the first and the second separation layers 52 and 54 are made of aluminum oxide. The first and the second separation layers 52 and 54 may be made of hafnium oxide.

Preferably, the first and the second polycrystalline tantalum oxide layers 51 and 53 have a thickness in a range form 4 nm to 4.8 nm. In this embodiment, the first and the second polycrystalline tantalum oxide layers 51 and 53 have a thickness of 4.5 nm. Preferably, the first and the second separation layers 52 and 54 have a thickness in a range from 1 nm to 1.5 nm. In this embodiment, the first and the second separation layers 52 and 54 have a thickness of 1.5 nm.

Preferably, the polycrystalline tantalum oxide layers have in total an equivalent oxide thickness (EOT) less than 0.7 nm. In this embodiment, the polycrystalline tantalum oxide layers have in total a thickness of 9 nm. Then, the polycrystalline tantalum oxide layers have in total an EOT of 0.67 nm. Preferably, the separation layers have in total EOT in a range from 1.1 nm to 1.3 nm. In this embodiment, separation layers have in total a thickness of 3 nm. Then, the separation layers have in total an EOT of 1.30 nm. Preferably, the dielectric layer 32 has an EOT of 2.0 nm or less. In this embodiment, the dielectric layer 32 has an EOT of 1.97 nm.

The conductive plug 15 comprises a silicon layer 60 and a barrier layer 61. The silicon layer 60 is a lower part of the conductive plug 15 and made of polysilicon. The barrier layer 61 comprises a metal silicide layer 62 arranged on the silicon layer 60 and a titanium nitride layer 63 on the metal silicide layer 62. The metal silicide layer 62 lowers the contact resistance between the silicon layer 60 and the lower electrode 31. In this embodiment, the metal silicide layer 62 is made of titanium silicide. The lower electrode 31 is in contact with the titanium nitride layer 63.

Figure 3:
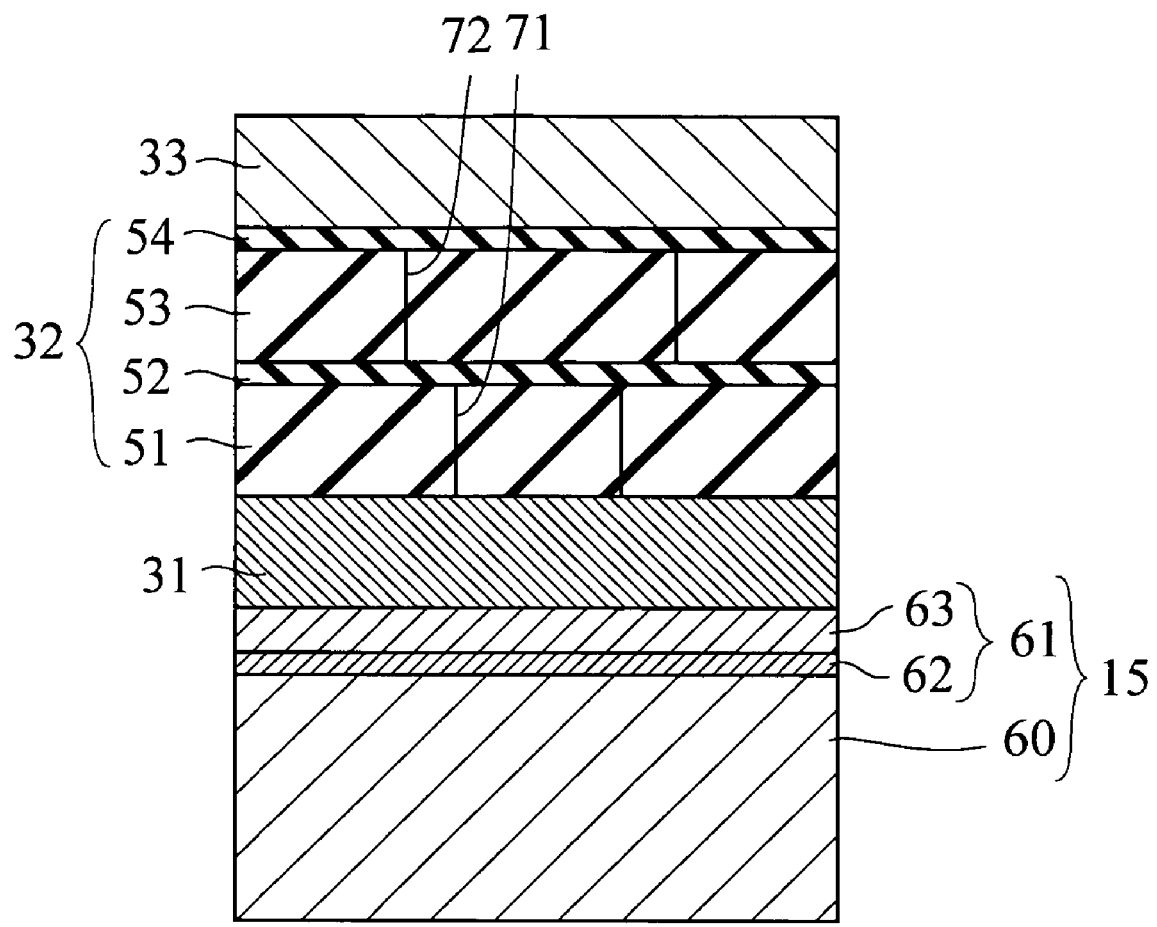
FIG. 3 is a partial sectional view of the stack trench capacitor of FIG. 2.

Referring to FIG. 3, the first polycrystalline tantalum oxide layer 51 has a first crystal grain boundary 71 extending from a lower surface to an upper surface of the first polycrystalline tantalum oxide layer 51. The second polycrystalline tantalum oxide layer 53 has a second crystal grain boundary 72 extending from a lower surface to an upper surface of the second polycrystalline tantalum oxide layer 53. The first separation layer 52 divides the first and the second polycrystalline tantalum oxide layers 51 and 53 so that there is no crystal grain boundary extending through out the dielectric layer 32.

Figure 4:
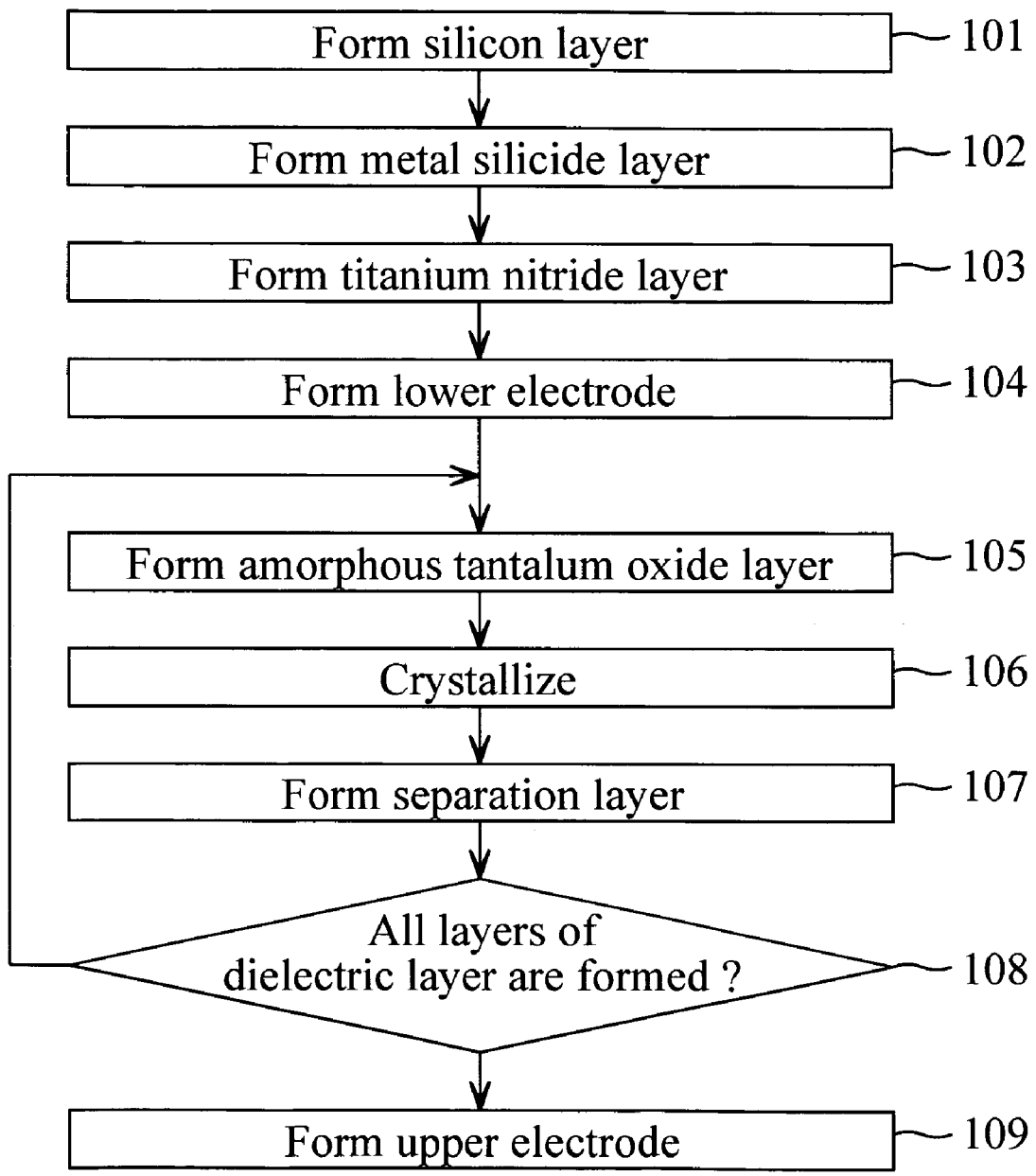
FIG. 4 is a flow chart of manufacturing steps for manufacturing the stack trench capacitors of FIG. 2.

FIG. 4 is a flow chart of manufacturing steps for manufacturing the stack trench capacitors 30 according to the preferred embodiment of the present invention. FIGS. 5 to 8 are partial sectional views of the manufacturing steps for the stack trench capacitors 30.

Figure 5:
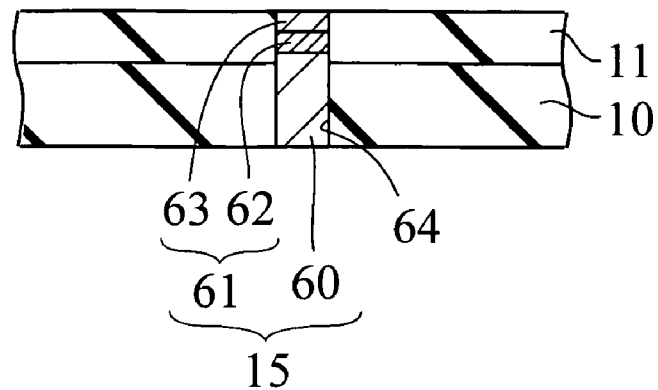
FIG. 5 is a partial sectional view of the stack trench capacitor of FIG. 2 at a processing step.

Referring to FIG. 5, after provision of the semiconductor substrate 1 including the first insulator 9 illustrated in FIG. 1, the second insulator 10 made of silicon oxide is deposited on the first insulator 9 and planarized. The third insulator 11 is deposited on the second insulator 10 by chemical vapor deposition (CVD). The second insulator 10 has a thickness of 500 nm and the third insulator 11 has a thickness of 50 nm. From a lower surface of the second insulator 10 to an upper surface of the third insulator 11 a contact hole 64 is formed by lithography and dry etching.

In step 101, the silicon layer 60 made of polysilicon including impurities is formed in the contact hole 64. The silicon layer 60 is formed by CVD using a monosilane ($SiH_4$) gas and a phosphine ($PH_3$) gas as source gases.

In step 102, titanium material is provided onto the silicon layer 62 so as to form the metal silicide layer 62 on the silicon layer 60. Before the forming of the metal silicide layer 62, an upper surface of the silicon layer 60 is cleaned up. The third insulater 11 prevent the etching of the second insulator 10 during the cleaning.

In step 103, the titanium nitride layer 63 is formed on the metal silicide layer 62 by CVD using a titanium chloride ($TiCl_4$) gas and an ammonia ($NH_3$) gas as source gases. After the titanium nitride layer 63 is formed, an upper surface of the titanium nitride layer 63 and an upper surface of the third insulator 11 are planarized by chemical mechanical polishing (CMP) so that the titanium nitride deposited on the third insulator 11 is removed. Preferably, the metal silicide layer 62 and the titanium nitride layer 63 are formed continuously in a same reaction apparatus. After steps 102 to 103, the barrier layer 61 is formed. After steps 101 to 103 the conductive plug 15 is formed.

Figure 6:
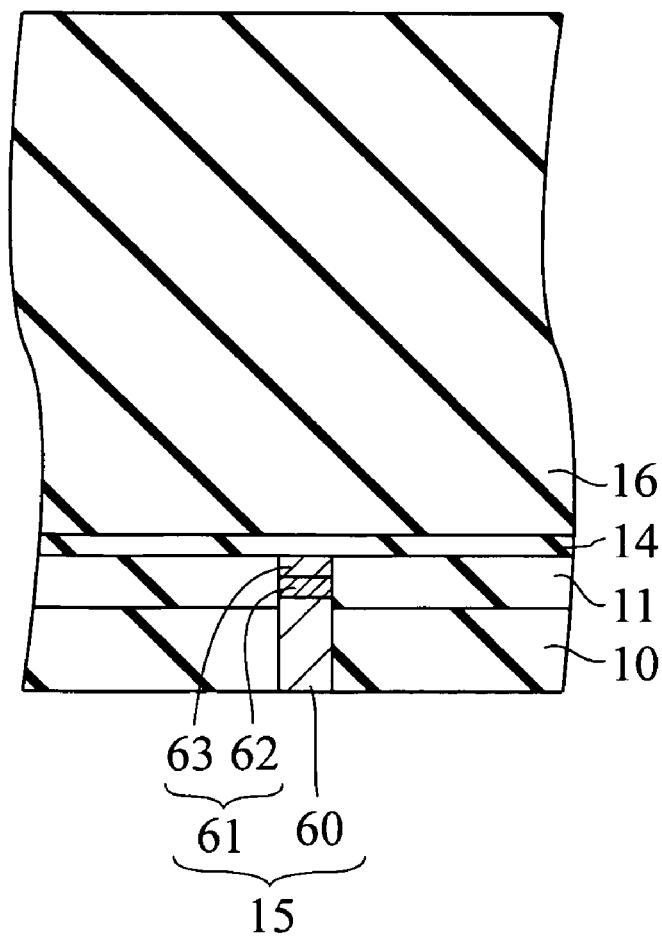
FIG. 6 is a partial sectional view of the stack trench capacitor of FIG. 2 at a processing step subsequent to that illustrated by FIG. 5.

Referring to FIG. 6, the fourth insulator 14 made of silicon nitride is formed on the third insulator 11 and the conductive plug 15. The fourth insulator 14 is formed by CVD. The fourth insulator 14 has a thickness of 50 nm. If the third insulator 11 made of silicon nitride is formed, the fourth insulator 14 may be omitted.

The fifth insulator 16 made of silicon oxide is formed on the fourth insulator 14. The fifth insulator 16 is formed by CVD. The fifth insulator 16 has a thickness of 2000 nm.

Figure 7:
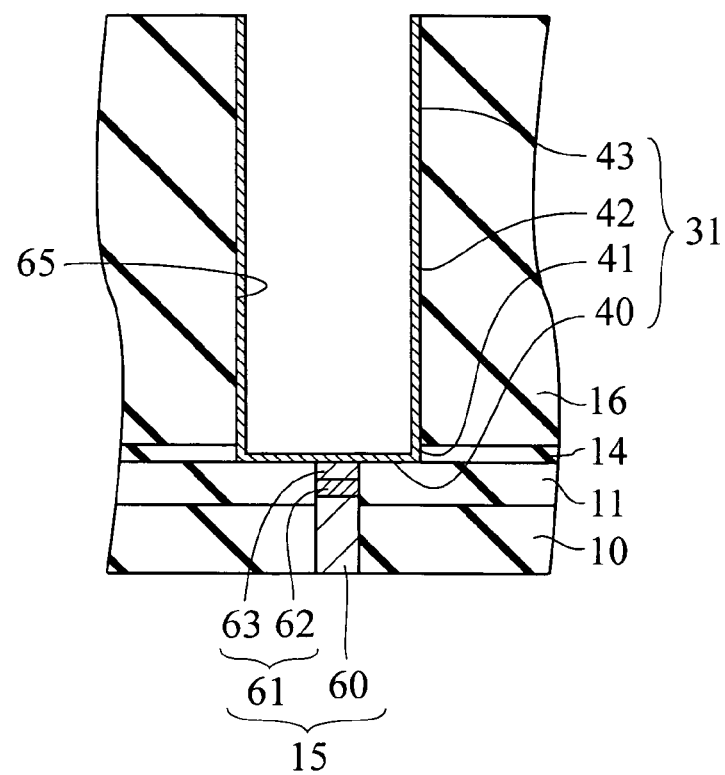
FIG. 7 is a partial sectional view of the stack trench capacitor of FIG. 2 at a processing step subsequent to that illustrated by FIG. 6.

Referring to FIG. 7, a trench 65 is formed from a lower surface of the fourth insulator 14 to an upper surface of the fifth insulator 16 so that an upper surface of the conductive plug 15 is exposed in the trench 65. The trench 65 is formed by dry etching using a silicon hard mask and using fluorine series gas plasma. After the trench 65 is formed, the silicon hard mask is removed and an inner surface of the trench 65 is cleaned up.

In step 104, tungsten nitride is deposited to cover an inner surface of the trench 65 by CVD using a tungsten fluoride ($WF_6$) gas, a hydrogen ($H_2$) gas and an ammonia ($NH_3$) gas as source gases at 400° C. so that the lower electrode 31 made of tungsten nitride is formed in the trench 65. The lower electrode 31 may be formed without the $NH_3$ gas so that the lower electrode 31 made of tungsten is formed. The lower electrode 31 has a thickness of 20 nm. The lower electrode 31 may be formed by atomic layer deposition (ALD). Before tungsten nitride is deposited, a seed layer may be formed by spattering or CVD. The lower electrode 31 may be made of a material selected from a group consisting of tungsten, tungsten compound, titanium nitride and ruthenium.

Figure 8:
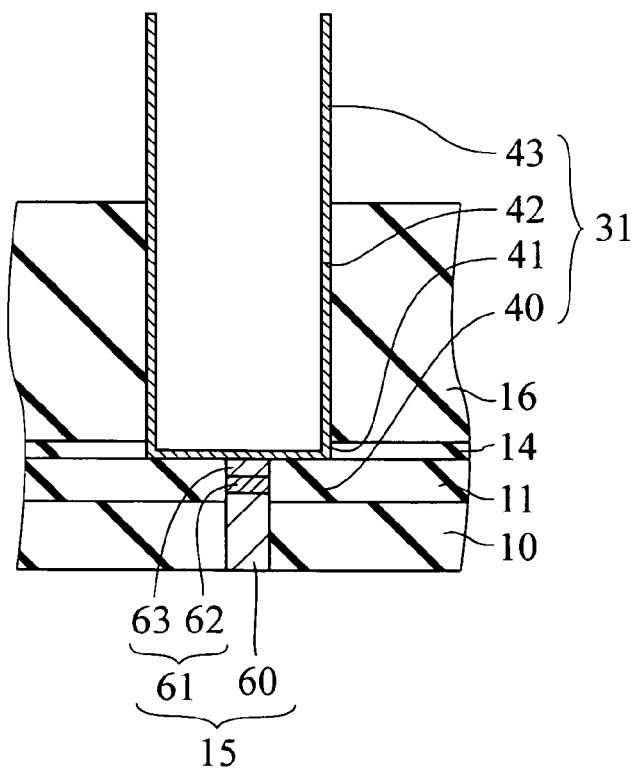
FIG. 8 is a partial sectional view of the stack trench capacitor of FIG. 2 at a processing step subsequent to that illustrated by FIG. 7.

Referring to FIG. 8, the lower electrode 31 is filled with photo resist, and the fifth insulator 16 is dry etched to expose an outer surface of the upper sidewall portion 43. The fifth insulator 16 may be etched by using a hydrofluoric acid series etching solution. The photoresist in the lower electrode 31 is removed by oxygen plasma ashing. After the oxygen plasma ashing, oxidized part of the lower electrode 31 is reduced by heat treatment in $H_2$ or $NH_3$ atmosphere. The photoresist in the lower electrode 31 is removed by using a solution which does not etch tungsten.

In step 105, on the fifth insulator 16 and the lower electrode 31, a first tantalum oxide layer made of amorphous tantalum oxide is deposited by ALD using a tantalum pentaethoxide (PET: $Ta(OC_2H_5)_5$) gas and a $H_2O$ gas as source gases. The first tantalum oxide layer is formed upon a condition where a temperature is kept at 300° C. Introducing the PET gas, purging gases, introducing the $H_2O$ gas and purging gases are repeated so that the first tantalum oxide layer is formed up to a thickness of 4.5 nm. A tantalum chloride ($TaCl_5$) gas and tetrakis(dimethylamido)tantalum (TDMATa: $Ta(N(CH_3)_2)_4$) may be used to form the first tantalum oxide layer.

In step 106, the first tantalum oxide layer is heat treated and crystallized in a non-oxidizing atmosphere at 720° C. for 30 seconds so that the tantalum oxide layer is changed into the first polycrystalline tantalum oxide layer 51 as shown in FIG. 2. The first tantalum oxide layer may be crystallized at 750° C. A nitrogen gas and an argon gas may be used as the non-oxidizing atmosphere. In this embodiment, a nitrogen gas is used as the non-oxidizing atmosphere.

In step 107, the first separation layer 52 made of aluminum oxide is formed by ALD using trimethylaluminum (TMA: $Al(CH_3)_3$) gas and a $H_2O$ gas as source gases. Introducing the TMA gas, purging gases, introducing the $H_2O$ gas and purging gases are repeated so that the first separation layer 52 is formed up to a thickness of 1.5 nm. The separation layer 52 is formed at 350° C.

In step 108, until all layers of dielectric layer 31 are formed, steps 105 to 107 are repeated. In this embodiment, steps 105 to 107 are repeated two times. A second tantalum oxide layer is formed on the first separation layer 52 and crystallized so that the second polycrystalline tantalum oxide layer 53 of 4.5 nm is formed. The first and the second polycrystalline tantalum oxide layers 51 and 53 are formed upon a same condition. The second separation layer 54 of 1.5 nm is formed on the second polycrystalline tantalum oxide layer 53. The first and the second separation layers 52 and 54 are formed upon a same condition.

The first and the second polycrystalline tantalum oxide layers 51 and 53 may be crystallized after both of the first and the second separation layers 52 and 54 are formed.

The first and the second separation layers 52 and 54 may be made of hafnium oxide and may be formed by using a tetrakis(ethylmethylamido)hafnium (TEMAHf) gas as a source material and an ozone ($O_3$) gas or an $H_2O$ gas as oxidizer at 300° C. In this embodiment, a dielectric constant of the first and the second separation layers 52 and 54 made of hafnium oxide is about 20. If the first and the second separation layers 52 and 54 made of hafnium oxide have in total a physical thickness of 6.6 nm, an EOT thereof is in total 1.3 nm.

Preferably, after the first tantalum oxide layer is formed, a heat treatment for the first tantalum oxide layer may be carried out in hydrogen atmosphere at 400° C. for 10 minutes. The lower electrode 31 is reduced during the heat treatment process. A heat treatment may be carried out after the first tantalum oxide layer is changed into the first polycrystalline tantalum oxide layer 51.

The lower electrode 31 may be made of metal or metal compound such as ruthenium.

In step 109, after the first and the second polycrystalline tantalum oxide layers 51 and 53 and the first and the second separation layers 52 and 54 are formed, the upper electrode 33 made of titanium nitride is formed. The upper electrode 33 is formed by CVD using a $TiCl_4$ gas and an $NH_3$ gas as source gases. The upper electrode 33 is formed in a temperature range form 500° C. to 550° C. The upper electrode 33 may be made by ALD in a temperature range form 350° C. to 400° C. A metal layers, such as tungsten layer, may be formed on the titanium nitride layer of the upper electrode 33 by spattering.

Figure 9:
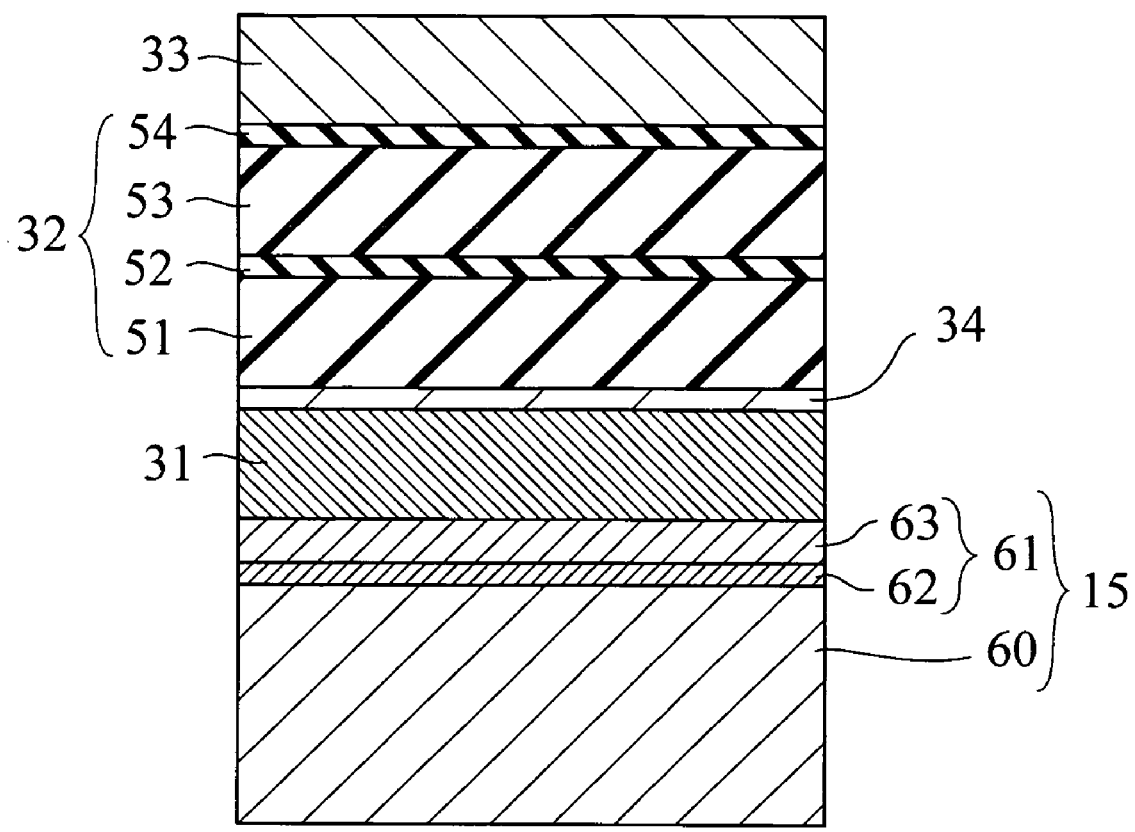
FIG. 9 is a partial sectional view of the stack trench capacitor which has an oxidation barrier layer.
Figure 10:
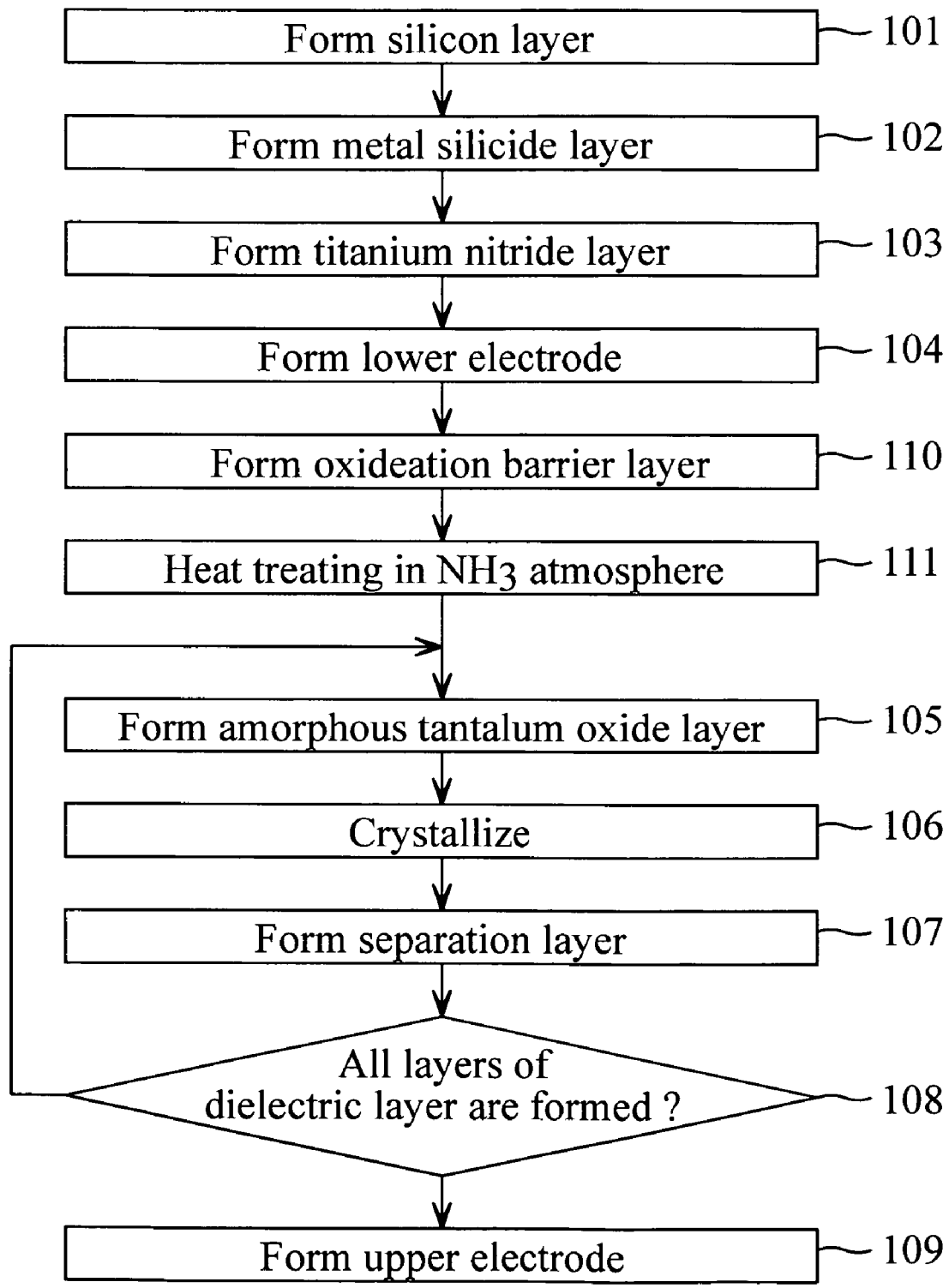
FIG. 10 is a flow chart of manufacturing steps for manufacturing the stack trench capacitors of FIG. 9.

Referring to FIG. 9, an oxidation barrier layer 34 may be arranged between the lower electrode 31 and the dielectric layer 32. FIG. 10 is a flow chart of manufacturing steps for manufacturing the stack trench capacitors 30 including the oxidation barrier layer 34. Referring to FIG. 10, after step 104, the oxidation barrier layer 34 made of tantalum nitride is deposited by ALD using a PET gas and an $NH_3$ gas as source gases at 350° C. in step 110. The oxidation barrier layer 34 has a thickness of 2 nm. In step 111, the deposited tantalum nitride layer is heat treated in an $NH_3$ atmosphere at 700° C. for 1 minute. The first tantalum oxide layer is formed on the oxidation barrier layer 34 in step 105.

The oxidation barrier layer 34 may be made of a material selected from a group consisting of aluminum nitride and hafnium nitride. The oxidation barrier layer 34 made of aluminum nitride is formed by ALD using a TMA gas and an $NH_3$ gas as source gases at 300° C. The oxidation barrier layer 34 made of aluminum nitride is oxidized and is changed into an aluminum oxide layer during the forming of the first and the second tantalum oxide layer. Preferably, the separation layers and the oxidation barrier layer 34 have in total an EOT in a range from 1.1 nm to 1.3 nm. If the oxidation barrier layer 34 is made of aluminum nitride, each of the first and the second separation layers 52 and 54 and the oxidation barrier layer 34 preferably have a thickness of 1 nm and has a same dielectric constant as the first and the second separation layers 52 and 54. Therefore, the first and the second separation layers 52 and 54 and the oxidation barrier layer 34 have in total a physical thickness of 3 nm and have in total an EOT of 1.3 nm or less.

The oxidation barrier layer 34 made of hafnium nitride is formed by ALD using a tetraethoxyhafnium (TEOHf: $Hf(OC_2H_5)_4$) gas and an ammonium gas as source gases at 300° C.

Figure 11:
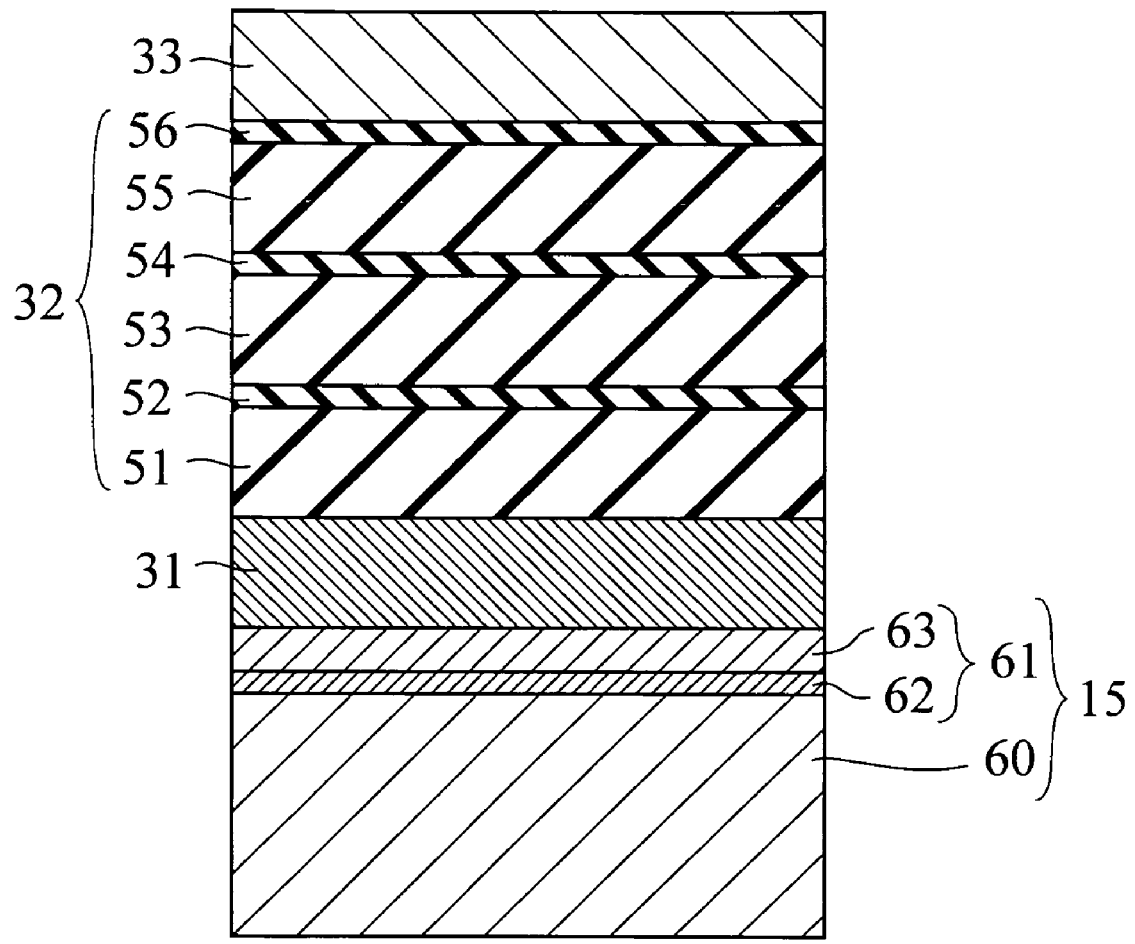
FIG. 11 is a partial sectional view of the stack trench capacitor which has a third polycrystalline tantalum oxide layer and a third separation layer.

The dielectric layer 32 may have three or more polycrystalline tantalum oxide layers and three or more separation layers. Referring to FIG. 11, a third polycrystalline tantalum oxide layer 55 and a third separation layer 56 may be arranged between the second separation layer 54 and the upper electrode 33. The third polycrystalline tantalum oxide layer 55 is arranged on the second separation layer 54. The third separation layer 56 is arranged on the third polycrystalline tantalum oxide layer 55. The upper electrode 33 is arranged on the third separation layer 56.

The first, the second and the third polycrystalline tantalum oxide layers 51, 53 and 55 may be thinned after each of the first, the second and the third polycrystalline tantalum oxide layers 51, 53 and 55 are formed.

Figure 12:
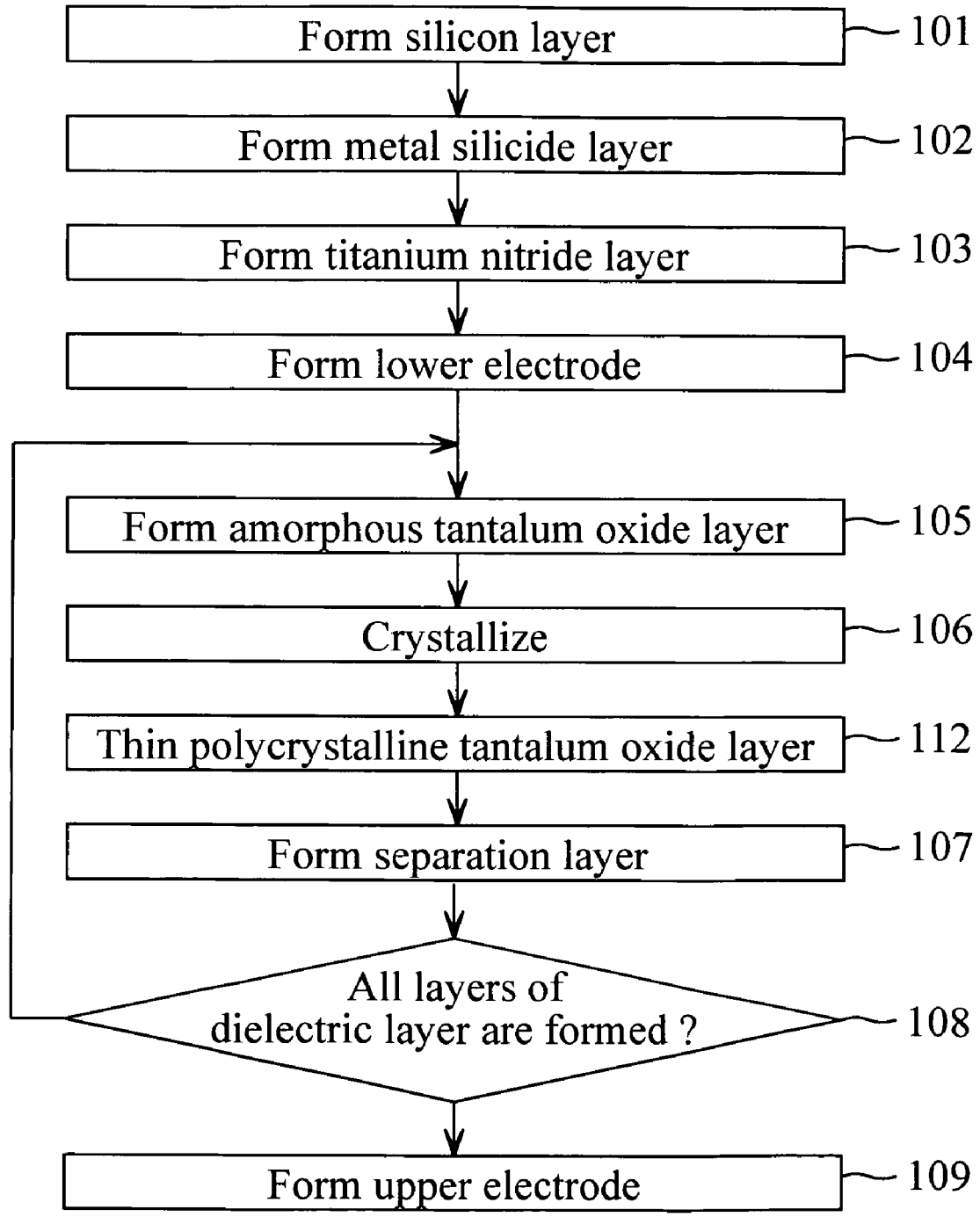
FIG. 12 is a flow chart of manufacturing steps for manufacturing the stack trench capacitors of FIG. 11.

FIG. 12 is a flow chart of manufacturing steps for manufacturing the stack trench capacitors 30 including the third polycrystalline tantalum oxide layer 55 and the third separation layer 56. After the first polycrystalline tantalum oxide layer 51 is formed in step 106, the first polycrystalline tantalum oxide layer 51 is thinned by plasma dry etching using a chlorine gas in step 112. In this embodiment, a mixed gas of a chlorine gas and an oxygen gas is used for the dry etching, wherein a pressure of an atmosphere is 1 torr and a plasma power is 100 W. Preferably, the first polycrystalline tantalum oxide layer 51 is dry etched about 2 nm so that the first polycrystalline tantalum oxide layer 51 has a thickness in a range from 3 to 3.5 nm. In this embodiment, the first polycrystalline tantalum oxide layer 51 has a thickness of 3 nm. After the first polycrystalline tantalum oxide layer 51 is thinned, the first separation layer 52 of 1 nm is formed. Steps 105, 106, 112 and 107 are repeated three times as indicated in step 108 so that the second polycrystalline tantalum oxide layer 53, the second separation layer 54, the third polycrystalline tantalum oxide layer 55 and the third separation layer 56 is formed.

Each of the first, the second and the third polycrystalline tantalum oxide layers 51, 53 and 55 has a thickness of 3 nm. Then, the polycrystalline tantalum oxide layers have in total a thickness of 0.6 nm. Each of the first, the second and the third separation layers 52, 54 and 56 has a thickness of 1 nm. The separation layers have in total a thickness of 1.3 nm. Therefore, the dielectric layer 32 has in total an EOT of 1.9 nm.

Figure 13:
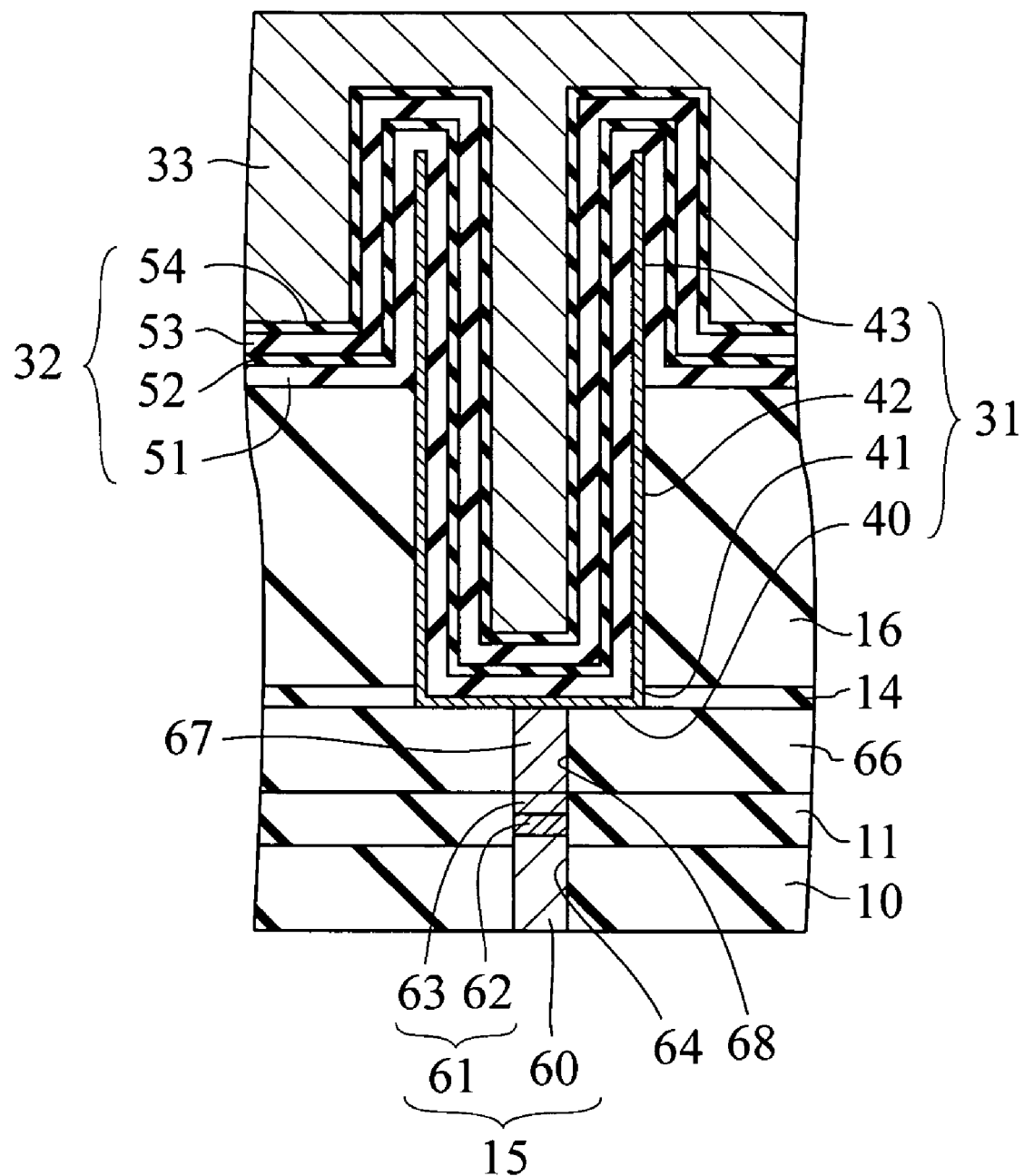
FIG. 13 is a partial sectional view of the stack trench capacitor which has a eighth insulator 66 and a ruthenium layer 67.

In another embodiment, referring to FIG. 13, the lower electrode 31 in made of ruthenium. An eighth insulator 66 made of silicon oxide is arranged between the third insulator 11 and the fourth insulator 14. The eighth insulator 66 has a thickness of 500 nm. The conductive plug 15 extends into the eighth insulator 66 and comprises a ruthenium layer 67. The ruthenium layer 67 is formed in the eighth insulator 66 and is in contact with the titanium nitride layer 63 and the lower electrode 31. The metal silicide layer 62 is made of ruthenium silicide.

Forming the eighth insulator 66 includes depositing ruthenium on the titanium nitride layer 63 by spattering, and heat treating the ruthenium on the titanium nitride layer 63 at 600° C. for 1 minute.

After the conductive plug 15 is formed, the eighth insulator 66 is formed on the third insulator 11 and the conductive plug 15 and is planarized. An upper contact hole 68 is formed in the eighth insulator 66. The upper contact hole 68 upwardly extends from the contact hole 64. The ruthenium layer 67 is formed by CVD, wherein a (ethylcyclopentadienyl)ruthenium ($Ru(EtCp)_2$: $Ru(C_2H_5C_5H_4)_2$) in tetrahydrofuran solution is evaporated and react with oxygen. The ruthenium layer 67 may be formed by ALD using $Ru(EtCp)_2$ and $NH_3$ gas as source gases. The ruthenium layer 67 is heat treated in hydrogen atmosphere at 750° C. for 1 minute so that an upper surface of the ruthenium layer 67 is planarized and impurities in the ruthenium layer 67 is reduced. In heat treatment of the ruthenium layer 67, the hydrogen atmosphere is reducing atmosphere. An ammonia gas may be used as the reducing atmosphere. The ruthenium layer 67 may includes a lower part and an upper part on the lower part. After the lower part of the ruthenium layer 67 is formed by CVD and is heat treated, the upper part of the ruthenium layer 67 is formed by CVD and is heat treated. After the ruthenium layer 67 is heat treated, ruthenium on the eighth insulator 66 is removed by plasma etching using an oxygen gas and a chlorine gas. The removing of the ruthenium may be carried out by CMP. Preferably, a height of the ruthenium layer 67 is 100 nm or more. In this embodiment, a height of the ruthenium layer 67 is 500 nm.

This application is based on Japanese Patent Application serial no. 2005-144780 filed in Japan Patent Office on May 17, 2005, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A semiconductor device with a capacitor comprising:
    a lower electrode;
    a dielectric layer comprising more than one polycrystalline tantalum oxide layer and more than one separation layer, wherein the polycrystalline tantalum oxide layers and the separation layers are alternately stacked, while one of the polycrystalline tantalum oxide layers is a lowermost layer among the stacked layers; and
    an upper electrode on the dielectric layer.

2. The semiconductor device according to claim 1, wherein each of the polycrystalline tantalum oxide layers has a thickness in a range from 3.0 nm to 4.8 nm.

3. The semiconductor device according to claim 1, wherein the separation layers is made of a material selected from a group consisting of aluminum oxide and hafnium oxide.

4. The semiconductor device according to claim 1 wherein:
    the polycrystalline tantalum oxide layers have in total an equivalent oxide thickness less than 0.7 nm; and
    the separation layers have in total an equivalent oxide thickness in a range from 1.1 nm to 1.3 nm.

5. The semiconductor device according to claim 1 further comprising an oxidation barrier layer arranged between the lower electrode and the dielectric layer.

6. The semiconductor device according to claim 5, wherein the oxidation barrier layer is made of a material selected from a group consisting of tantalum nitride, aluminum nitride and hafnium nitride.

7. The semiconductor device according to claim 5 wherein:
   the polycrystalline tantalum oxide layers have in total an equivalent oxide thickness less than 0.7 nm; and
   the separation layers and the oxidation barrier layer have in total an equivalent oxide thickness in a range from 1.1 nm to 1.3 nm.

8. The semiconductor device according to claim 1 further comprising a conductive plug, wherein:
   the conductive plug comprises a silicon layer, a ruthenium silicide layer on the silicon layer, a titanium nitride layer on the ruthenium silicide layer and a ruthenium layer on the titanium nitride layer; and
   the lower electrode is made of ruthenium and is arranged on the titanium nitride layer.

9. The semiconductor device according to claim 8, wherein the ruthenium layer has a thickness of 100 nm or more.

* * * * *